United States Patent [19]

Overweg et al.

[11] Patent Number: 4,878,023
[45] Date of Patent: Oct. 31, 1989

[54] MAGNETIC RESONANCE APPARATUS COMPRISING AN IMPROVED GRADIENT COIL SYSTEM

[75] Inventors: Johannes A. Overweg; Cornelis L. G. Ham, both of Eindhoven, Netherlands

[73] Assignee: U.S. Philips Corporation, New York, N.Y.

[21] Appl. No.: 233,310

[22] Filed: Aug. 17, 1988

[30] Foreign Application Priority Data

Aug. 19, 1987 [NL] Netherlands ................... 8701948

[51] Int. Cl.⁴ .............................................. G01R 33/20
[52] U.S. Cl. ...................................... 324/318; 324/322
[58] Field of Search ............... 324/300, 307, 309, 318, 324/319, 320, 322; 128/653

[56] References Cited

U.S. PATENT DOCUMENTS

| | | | |
|---|---|---|---|
| 4,486,711 | 12/1984 | Frese et al. | 324/319 |
| 4,506,224 | 3/1985 | Krause | 324/319 |
| 4,585,995 | 4/1986 | Flagan | 324/318 |
| 4,607,225 | 8/1986 | Crooks | 324/318 |
| 4,639,672 | 1/1987 | Beaumont | 324/318 |
| 4,698,591 | 10/1987 | Glover | 324/318 |
| 4,737,716 | 4/1988 | Roemer et al. | 324/319 |
| 4,761,612 | 8/1988 | Holland | 324/322 |
| 4,785,246 | 11/1988 | Sugimoto | 324/318 |

FOREIGN PATENT DOCUMENTS 0216590  1/1987  European Pat. Off. .

Primary Examiner—Michael J. Tokar
Attorney, Agent, or Firm—Thomas A. Briody; Jack E. Haken; Jack D. Slobod

[57] ABSTRACT

In a magnetic resonance apparatus a gradient coil system in which "return" arc conductors, which contribute substantially less to the gradient field formation because they are situated further outwards radially and/or axially from the center of the system, are positioned to compensate for stray fields of "effective" arc conductors, which are more centrally situated and which contribute more substantially to the gradient field formation. Due to both radial and axial displacement of the return arc conductors relative to the effective arc conductors, the measuring space of the apparatus can be conically shaped, so that a higher patient accessibility is achieved or a smaller diameter can be imparted to a central portion.

21 Claims, 2 Drawing Sheets

MAGNETIC RESONANCE APPARATUS COMPRISING AN IMPROVED GRADIENT COIL SYSTEM

BACKGROUND OF THE INVENTION

1. Field of the Invention

The invention relates to a magnetic resonance apparatus, comprising a magnet system for generating a steady magnetic field and a coil system for generating mutually perpendicular gradient fields.

2. Description of the Prior Art

A magnetic resonance apparatus of this kind is known from EP-A-216590. A gradient coil system described therein comprises a number of saddle coils for generating X- and Y-gradient fields for a magnetic resonance apparatus in which the direction of the steady magnetic field coincides with the (Z-) axis of a cylindrical measuring space. A gradient coil system of this kind is usually surrounded by one or more electrically conductive cylinders, for example walls and radiation shields of a superconducting magnet. When the current in gradient coils is switched, eddy currents are induced in these electrically conductive cylinders, which eddy currents counteract the desired gradient fields. The attenuation of the effective gradient field can partly be compensated for by means of an adjustable "overshoot" in the current through the gradient coils. The overshoot in the current (and hence also the electrical power to be delivered) is highly dependent on the ratio of the diameter of the smallest shield surrounding the coil and the diameter of the coil itself. The electrical power for the coil increases as the diameter of the electrically conductive cylinder decreases.

The eddy currents not only attenuate the desired gradients but also distort the gradient fields. The relationship between location and effective field strength is then different from the situation where the gradient coil is arranged so as to be isolated. Moreover, this relationship between field and location will generally be time-dependent, because the eddy currents will decay with a given time constant. Notably this time-dependency will generally lead to undesired distortions in the MR images.

If the eddy currents were not to decay in time, the effect of the eddy currents would remain limited to an increase of the electrical power required and the distortion of the images obtained. The distortion could in principle be avoided by taking the eddy currents into account in the design of the coil, so that the effective field would have the desired shape as well as possible. The decay of the eddy currents could in principle be prevented by surrounding the gradient coils by means of a superconducting shield. However, this will be difficult to realize for the time being. An alternative method, offering a comparable result, consists in the mounting of a system of 'shielding coils' which are designed so that therein the current patterns are simulated which would arise in a superconducting shield. By powering this shielding coil with an active power supply, the time-dependency of the eddy current field will be eliminated.

Such a system of shielding coils, however, does not offer a solution to the electrical power required for the current overshoot; to the contrary, when the current in the coil is switched the effect of the shielding coil is substantially the same as the effect which would be exerted by a conductive shield on the diameter of the shielding coil and, because this diameter will always be smaller than the diameter of the cryostatic shields in which otherwise the eddy currents would be introduced, the total power required will be substantially higher.

SUMMARY OF THE INVENTION

It is the object of the invention to mitigate the problem imposed by the eddy currents introduced by a transversal gradient coil without increasing the total electrical power required for the gradient coil beyond the power required for a comparable conventional gradient coil including its eddy currents. To achieve this, a magnetic resonance apparatus of the kind set forth in accordance with the invention is characterized in that return arc conductors of the gradient coil system are located within the coil system so that they compensate for stray fields of arc conductors which effectively contribute to the formation of the gradient fields.

By utilizing the fact that a conventional X- and Y-gradient coil comprises conductors which hardly contribute to the generating of the desired fields but which serve merely for the completion of the closed circuits of the saddle coils forming such a gradient coil, stray fields of the effective arc conductors can be compensated for without the stored energy of the coil system being increased for this purpose.

In a preferred embodiment, current return arcs which are situated further outwards, viewed in the axial direction, are displaced to a larger diameter and are, moreover, positioned more centrally in the system, again viewed in the axial direction. By suitably distributing a part of the return arcs across a cylinder surface having a larger diameter in this manner, the resultant stray field of the entire coil system can be reduced to only a fraction of the stray field of a comparable conventional gradient coil.

Because said return arcs make a substantial contribution to the power stored in known coil systems, this power is not increased by the step in accordance with the invention.

The gradient coil system for generating X-gradient fields notably comprises two saddle coils, each of which comprises a compensating saddle coil. These coils are pairwise symmetrically positioned with respect to a $Z=0$ radial symmetry plane of the coil system. At least a part of the arc conductors which are situated further outwards, viewed in the axial direction, is thus replaced, or rather compensated for, by arcs of the inner coil. A suitable connection in this respect is, for example the series connection of return arcs of compensation coils and arc conductors of gradient coils which are situated further outwards. The major advantage of this construction consists in that the total power stored in the coil system is substantially lower and can approximate substantially the level of an isolated gradient coil system. This eliminates the drawback imposed by field disturbances caused by eddy currents as well as the drawback imposed by the high energy contents of the coil system.

By using the freedom in the positioning of arc conductors which are situated further outwards in the axial direction, in a preferred embodiment a larger diameter is chosen for the arc conductors situated at that area. The accessibility of a patient positioned in the apparatus is thus increased and the apparatus becomes more patient friendly; on the other hand, a smaller diameter can be imparted to more centrally situated arc conductors, so that a further energy saving can be realized. More specifically, more centrally situated arc conductors which substantially contribute to the desired field formation can be coupled, via conductive connections which do not extend strictly axially, to return arcs which are situated further outwards and which extend along a circular circumference of larger diameter. Notably the return arcs need not extend strictly circularly; an adapted degree of axial and radial orientation can be imparted thereto, if desirable, for field formation, field compensation or geometry.

A further embodiment of the coil system comprises stacks of axially or radially stacked arc conductors as described in detail in U.S. patent application Ser. No. 233,307 filed by Applicant simultaneously with the present Application.

BRIEF DESCRIPTION OF THE DRAWING

Some preferred embodiments in accordance with the invention will be described in detail hereinafter with reference to the drawing. Therein.

Figure 1:
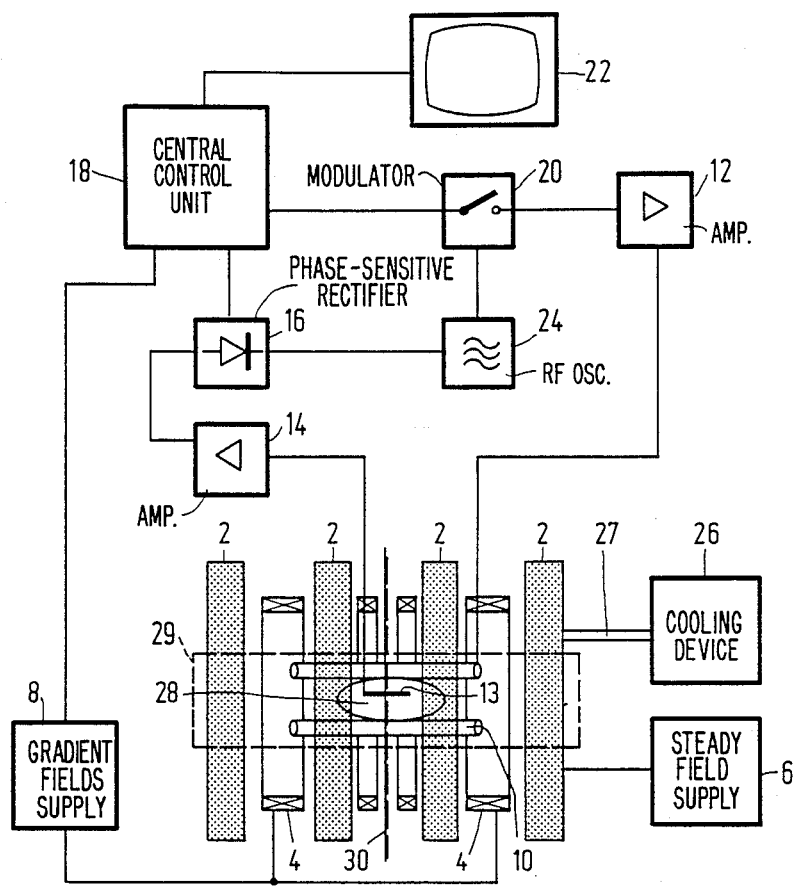
FIG. 1 shows a magnetic resonance apparatus in accordance with the invention.

A magnetic resonance apparatus as shown in FIG. 1 comprises a magnet system 2 for generating a steady, uniform magnetic field, a magnet system 4 for generating magnetic gradient field, and power supply sources 6 and 8 for the magnet system 2 and the magnet system 4, respectively. An r.f. coil 10 for generating an r.f. magnetic field is connected to an r.f. source formed by the output of amplifier 12. For the detection of magnetic resonance signals generated by the r.f. transmitter field in an object to be examined the present embodiment utilizes a surface coil 13. For read purposes the coil 13 is connected to a signal amplifier 14. The signal amplifier 14 is connected to a phase-sensitive rectifier 16 which is connected to a central control unit 18. The central control unit 18 also controls a modulator 20 for the r.f. source 12, the power supply source 8 for the gradient coils, and a monitor 22 for display. An r.f. oscillator 24 controls the modulator 20 as well as the phase-sensitive rectifier 16 which processes the measuring signals. A cooling device 26 with cooling ducts 27 may be provided for cooling. A cooling device of this kind may be constructed as a water cooling system for resistance coils or as a dewar system for cooled superconducting coils. The transmitter coil 10, arranged within the magnet systems 2 and 4, encloses a measuring space 28 which offers adequate space for accommodating patients in the case of an apparatus for medical diagnostic measurements. A steady magnetic field, gradient fields for position selection of slices to be imaged, and a spatially uniform r.f. alternating field can thus be generated in the measuring space 28.

A gradient magnet system 4 is symmetrically arranged with respect to a radial symmetry plane 30 in the usual manner, which radial symmetry plane thus symmetrically divides the measuring space into two halves and is directed through a point Z=0, perpendicularly to a Z-axis of the magnet system. The steady magnetic field generated by the steady magnet system is directed along the Z-axis. A gradient magnet system in a magnetic resonance apparatus comprises a coil system for each of the coordinate directions in the usual manner; said coil systems can generate fields with gradients in each of said directions and enable the pointwise imaging of an object. The coil systems in a gradient coil system in accordance with the invention are also identical for the X- and the Y-gradient and are rotated through 90° with respect to one another.

Figure 2:
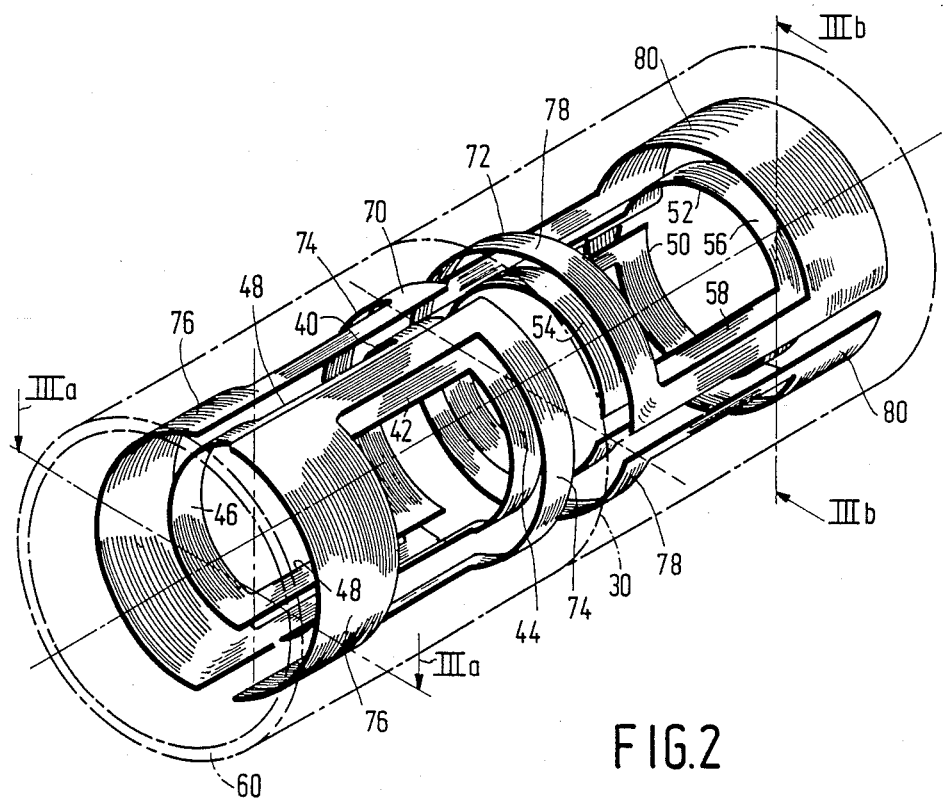
FIG. 2 is a diagrammatic perspective view of a gradient coil system for the above apparatus.

FIG. 2 shows X-gradient coils 40 and 42 which are situated at one side of the Z =0 symmetry plane 30 in a coil system 4 for a magnetic resonance apparatus. Each of these coils, being shaped as a saddle coil, comprises a number of arc conductors 44 which are not separately shown and which are situated near the plane 30, and a number of arc conductors 46 which are situated at a side of the coil system which is remote from the Z=0 plane. Each coil also comprises a number of axial conductors 48 which interconnect the arc conductors. Similarly, two Y-gradient coils 50 and 52, in this case situated at an opposite side of the Z =0 plane, comprise a number of arc conductors 54 which are situated near the Z=0 plane 30, a number of arc conductors 56 which are remote from the plane Z=0, and a number of axially extending connection conductors 58. Viewed azimuthally, the Y-gradient coils are rotated through 90° with respect to the X-gradient coils. It is to be noted that X-gradient coils as well as Y-gradient coils are situated at both sides of the plane Z=0. Arc conductors for both coils for X-gradient fields and for Y-gradient fields are situated at least partly mutually interlined in a customary manner and can cover different arc angles.

Figures 3A, 3B:
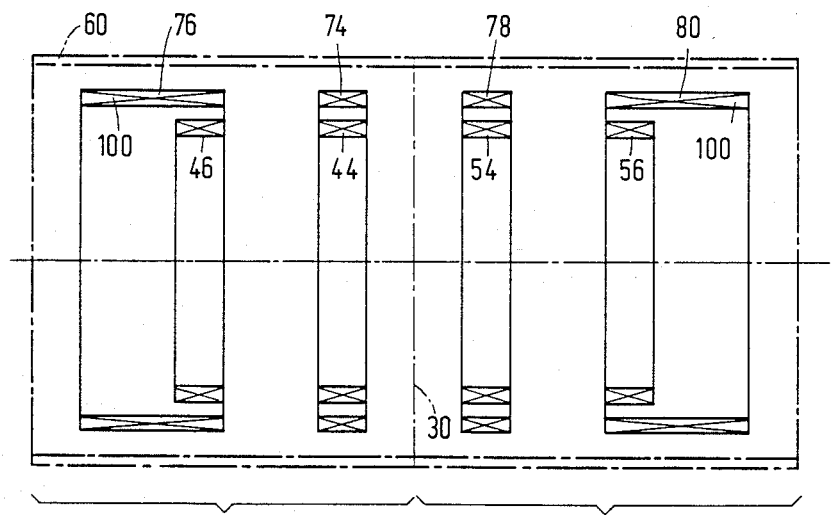
FIGS. 3a and 3b are sectional views of an embodiment of such a coil system.

The occurrence of disturbing eddy currents can be reduced by arranging return arcs on a cylindrical surface having a larger diameter. Coils 70 and 72 with arc conductors 74 and 76 and arc conductors 78 and 80, respectively, of a compensating coil system are shown. In the same way as the most centrally situated arc conductors 44 and 54 make the most substantial contribution to the formation of the desired gradient fields, mainly the centrally situated arc conductors 74 and 78 of the compensating coils contribute to the reduction of eddy currents in the shield 60. Because the shields of the coil system disclosed in EP-A-216590 which take up a comparatively large amount of eddy current power are thus omitted, a substantial saving is realized as regards the energy stored in the coil system. As a result, less power will be required for activating the coils and switching can be faster. Because the current direction is opposed in corresponding return arc conductors of the gradient coils and of the compensating coils and the total amount of current to be returned is in the same order of magnitude for both systems, a far-reaching compensation can be realized in comparison with separate compensation coils. Notably arc conductors which do not contribute essentially to the gradient field can be displaced, at least partly, to a larger diameter with adapted axial positioning, if so desired for optimum field formation or compensation. An example of a modified geometry of the coil system is given in FIG. 3, being an axial sectional view of the system. The arc conductors 44, 46, 54 and 56 for the gradient coils and arc conductors 74, 76, 78 and 80 for the compensating coils described in reference to FIG. 2 are again indicated. Return arc conductors 100 can thus be considered to be gradient coil arcs and compensating coil arcs. A geometrically more attractive position can be imparted to these arc conductors; for example, as indicated a larger diameter can be realized in comparison with the gradient coil arcs, so that the described advantages are obtained. Within the scope of the invention, a coil system can be composed in which more centrally situated arc conductors, making a substantial contribution to the gradient fields, are coupled to return arcs via conductive conductors which do not extend strictly axially but also slightly radially, which return arcs extend across a cylinder arc having a larger radius. Notably the return arcs need not be strictly circular arcs. In practical embodiments a given axial shift can also occur within the arc, again for adaptation to requirements imposed as regards field homogeneity, compensation and geometry. For example, conductors on an inner cylinder surface can be interconnected, via more or less radially extending connections, to conductors on a surface of a cylinder of larger diameter. Conductors which are situated further outwards contribute, possibly only to a small degree, to the desired gradient field and compensate for stray fields which would otherwise emerge.

What is claimed is:

1. A magnetic resonance apparatus comprising a magnet system for generating a steady magnet field parallel to a central axis in a measurement space and a gradient coil system for selectively generating a gradient magnetic field in said measurement space superimposed on said steady magnetic field, said coil system comprising electrically series-connected effective and return art conductors lying in planes intersecting said central axis, said effective arc conductors contributing more substantially to the generation of said gradient magnetic field than said return arc conductors, characterized in that said return arc conductors are positioned to compensation for stray magnetic fields generated by said effective arc conductors.

2. A magnetic resonance apparatus as claimed in claim 1, characterized in that the return arc conductors of the coil system extend across a cylinder surface having a diameter which is larger than that of the effective arc conductors.

3. A magnetic resonance apparatus as claimed in claim 1, characterized in that the gradient coil system comprises substantially saddle-shaped X- and Y-gradient coils each having effective arc conductors which are electrically connected in series with return arc conductors which extend across a larger diameter arc than that of the effective arc conductors.

4. A magnetic resonance apparatus as claimed in claim 1, characterized in that the gradient coil system comprises substantially ring-shaped arc conductors which are combined in the axial direction so as to form stacks.

5. A magnetic resonance apparatus as claimed in claim 1, characterized in that the gradient coil system comprises substantially ring-shaped arc conductors which are combined in the radial direction so as to form stacks.

6. A magnetic resonance apparatus as claimed in claim 1, characterized in that the return arcs conductors extend along arcs which are not strictly circular.

7. A magnetic resonance apparatus as claimed in claim 1 wherein said gradient coil system has a central symmetry plane transverse to said central axis, said coil system including effective arc conductors located relatively close to both said symmetry plane and said axis and return arc conductors, in series with said effective arc conductors, located relatively far from both said symmetry plane and said axis.

8. A magnetic resonance apparatus as claimed in claim 7 wherein said relatively far return arc conductors lie on the surface of an outer cylinder, coaxial with said axis, and said relatively close effective arc conductors lie on the surface of an inner cylinder, within and coaxial with said outer cylinder.

9. A magnetic resonance apparatus as claimed in claim 2, characterized in that the gradient coil system comprises substantially saddle-shaped X- and Y-gradient coils each having effective arc conductors which are electrically connected in series with return arc conductors which extend across a larger diameter arc than that of the effective arc conductors.

10. A magnetic resonance apparatus as claimed in claim 2, characterized in that the gradient coil system comprises substantially ring-shaped arc conductors which are combined in the axial direction so as to form stacks.

11. A magnetic resonance apparatus as claimed in claim 3, characterized in that the gradient coil system comprises substantially ring-shaped arc conductors which are combined in the axial direction so as to form stacks.

12. A magnetic resonance apparatus as claimed in claim 7, characterized in that the gradient coil system comprises substantially ring-shaped arc conductors which are combined in the axial direction so as to form stacks.

13. A magnetic resonance apparatus as claimed in claim 8, characterized in that the gradient coil system comprises substantially ring-shaped arc conductors which are combined in the axial direction so as to form stacks.

14. A magnetic resonance apparatus as claimed in claim 2, characterized in that the gradient coil system comprises substantially ring-shaped arc conductors which are combined in the radial direction so as to form stacks.

15. A magnetic resonance apparatus as claimed in claim 3, characterized in that the gradient coil system comprises substantially ring-shaped arc conductors which are combined in the radial direction so as to form stacks.

16. A magnetic resonance apparatus as claimed in claim 7, characterized in that the gradient coil system comprises substantially ring-shaped arc conductors which are combined in the radial direction so as to form stacks.

17. A magnetic resonance apparatus as claimed in claim 8, characterized in that the gradient coil system comprises substantially ring-shaped arc conductors which are combined in the radial direction so as to form stacks.

18. A magnetic resonance apparatus as claimed in claim 2, characterized in that the return arc conductors extend along arcs which are not strictly circular.

19. A magnetic resonance apparatus as claimed in claim 3, characterized in that the return arc conductors extend along arcs which are not strictly circular.

20. A magnetic resonance apparatus as claimed in claim 7, characterized in that the return arc conductors extend along arcs which are not strictly circular.

21. A magnetic resonance apparatus as claimed in claim 8, characterized in that the return arc conductors extend along arcs which are not strictly circular.

* * * * *